United States Patent
Rattner et al.

(10) Patent No.: US 6,846,746 B2
(45) Date of Patent: Jan. 25, 2005

(54) METHOD OF SMOOTHING A TRENCH SIDEWALL AFTER A DEEP TRENCH SILICON ETCH PROCESS

(75) Inventors: Michael Rattner, Santa Clara, CA (US); Jeffrey D. Chinn, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/137,543

(22) Filed: May 1, 2002

(65) Prior Publication Data

US 2003/0211752 A1 Nov. 13, 2003

(51) Int. Cl.⁷ ............................................. H01L 21/302
(52) U.S. Cl. ..................... 438/706; 438/700; 438/710; 216/67
(58) Field of Search ................................. 438/700, 706, 438/710, 712, 720, 714, 713; 216/58, 63, 67, 57

(56) References Cited

U.S. PATENT DOCUMENTS

| | | | | |
|---|---|---|---|---|
| 5,348,905 A | * | 9/1994 | Kenney | 438/720 |
| 5,501,893 A | | 3/1996 | Laermer et al. | |
| 5,747,839 A | * | 5/1998 | Hammond et al. | 257/253 |
| 5,817,579 A | * | 10/1998 | Ko et al. | 438/740 |
| 5,914,523 A | * | 6/1999 | Bashir et al. | 257/520 |
| 6,051,503 A | | 4/2000 | Bhardwaj et al. | |
| 6,071,822 A | * | 6/2000 | Donohue et al. | 438/712 |
| 6,127,273 A | | 10/2000 | Laermer et al. | |
| 6,187,685 B1 | * | 2/2001 | Hopkins et al. | 438/710 |
| 6,218,084 B1 | * | 4/2001 | Yang et al. | 430/329 |
| 6,284,148 B1 | | 9/2001 | Laermer et al. | |
| 6,333,601 B1 | * | 12/2001 | Wickramanayaka | 315/111.41 |
| 6,348,374 B1 | * | 2/2002 | Athavale et al. | 438/243 |
| 6,426,254 B2 | * | 7/2002 | Kudelka et al. | 438/246 |
| 6,689,662 B2 | * | 2/2004 | Blanchard | 438/268 |

FOREIGN PATENT DOCUMENTS

WO        WO 00/67307         11/2000

OTHER PUBLICATIONS

Yan Ye et al., "0.35–micron and sub–0.35–micron Metal Stack Etch in a DPS Chamber—DPS Chamber and Process Characterization," Electrochemical Society Proceedings, 1996, pp. 222–233.

* cited by examiner

Primary Examiner—Lan Vinh
(74) Attorney, Agent, or Firm—Shirley L. Church; Kathi Bean

(57) ABSTRACT

Disclosed herein is a method of smoothing a trench sidewall after a deep trench silicon etch process which minimizes sidewall scalloping present after the silicon trench etch. The method comprises exposing the silicon trench sidewall to a plasma generated from a fluorine-containing gas, at a process chamber pressure within the range of about 1 mTorr to about 30 mTorr, for a time period within the range of about 10 seconds to about 600 seconds. A substrate bias voltage within the range of about −10 V to about −40 V is applied during the performance of the post-etch treatment method of the invention.

20 Claims, 5 Drawing Sheets

US 6,846,746 B2

METHOD OF SMOOTHING A TRENCH SIDEWALL AFTER A DEEP TRENCH SILICON ETCH PROCESS

BACKGROUND OF THE INVENTION

1. Field of the Invention

The present invention pertains to a method of smoothing a trench sidewall after a deep trench silicon etch process. In particular, the present invention pertains to a post-etch treatment method for smoothing a scalloped sidewall surface present after a deep trench silicon etch process.

2. Brief Description of the Background Art

Deep trench silicon etching is one of the principal technologies currently being used to fabricate microstructure devices, and is an enabling technology for many microelectromechanical systems (MEMS) applications. Deep trench etching of silicon is traditionally accomplished using one of two methods. The first of these methods is wet KOH etching, which has many limitations. One significant limitation of wet KOH etching is that the etch taper is fixed by the crystalline lattice structure of the substrate which, in the case of single-crystal silicon, produces a taper angle of 54.7°, because the etch occurs along the [100] crystal planes. This lack of profile variability means that devices have to be designed to wet KOH etch limitations. When fabricating trenches having a taper angle greater than 54.7°, KOH etching is limited to silicon wafers having a [111] crystal orientation. This can cause compatibility problems with processing steps that may work only on [100] oriented silicon wafers. Another issue with KOH wet etching is that it requires the use of a hard mask, such as an oxide or nitride mask, which increases the fabrication costs. Further, in terms of process integration, since wet etching cannot be performed in a vacuum, and most semiconductor processing chambers are designed to operate under vacuum, wet etches are generally avoided in semiconductor production lines. If MEMS are to become mainstream production products, process integration of MEMS may also dictate the avoidance of wet etch processes. The use of wet etch processes, such as KOH etching, is also limited to situations where the creation of residue particles and process chamber contamination issues are not as important, such as in a research environment, where product yield is not essential.

In contrast to wet etching, dry etching has many advantages in production processes. For example, dry etching allows for better stoichiometric control of the etch environment because the gases flow continuously, causing the concentration of gases in the chamber to be more constant over time. Further, dry etching processes are typically performed in a vacuum, which tends to remove particulate etch byproducts from the process chamber, leading to decreased particulate contamination of the substrate wafer.

Currently, the most commonly used single-crystal silicon deep trench etch process is based upon a cyclic plasma etch/polymer deposition method. The process enables the removal of at least one micron (1 μm) of silicon per etch cycle. During the etch portion of the etch/deposition process, the principal etchant is often $SF_6$, which may be used in combination with a diluent so that the $SF_6$ concentration in the etchant plasma source gas is at least about 75% by volume. During the polymer deposition portion of the process, a plasma generated from polymer-forming gases such as $CHF_3$ is introduced to the chamber to produce polymer coatings on the trench sidewall. The polymer coating helps prevent lateral etching of the trench sidewall during a vertical etch portion of a subsequent cycle. Typical process conditions for performing a presently known etch/deposition method are as follows: 500 W–3000 W plasma source power; 0–100 W substrate bias power; 5 mTorr–300 mTorr process chamber pressure; and 40° C.–120° C. substrate temperature.

FIGS. 1A–1E illustrate the steps in a presently known etch/deposition process for forming a deep trench in silicon. FIG. 1A shows a typical starting structure 100 for performing the etch/deposition process. Structure 100 comprises a patterned photoresist layer 104 overlying a bare silicon wafer 102. FIG. 1B shows structure 100 after performance of a relatively anisotropic $SF_6$ etch for initial trench 106 formation. FIG. 1C shows structure 100 after the performance of a first polymer deposition step. A thick layer 108 of polymer has been deposited on the bottom and sidewalls of trench 106. FIG. 1D shows the structure 100 after the start of the second $SF_6$ etch cycle. The bottom 110 of trench 106 has been cleared of polymer. FIG. 1E shows structure 100 after the completion of the second $SF_6$ etch step. The width $w_2$ of the lower trench 112 is smaller than the width $w_1$ of the upper trench 106, due to the smaller effective mask size which results from the continued presence of polymer 108 on the sidewalls of upper trench 106. A typical deep trench (trench having a depth of about 40 μm) sidewall formed using this method has an angle θ of about 88° to about 89° from a horizontal line drawn at the bottom of the trench.

While the etch/deposition cycle process described above and shown in FIGS. 1A–1E has many advantages over wet etching, the cycling of gases in the etch/deposition process introduces a unique type of sidewall roughness known as scalloping. FIG. 2 shows an open area 204 etched in a silicon substrate 202 to form a silicon trench sidewall 206 exhibiting 0.8 micron deep (d) scallops 208. Scalloping occurs because the $SF_6$ etch is relatively isotropic. Because of the discontinuous etch and deposition steps in a silicon etch/polymer deposition process, the etch profile of a single etch step is not flat, but rather it is concave with respect to etched open area 204. Every etch/deposition cycle leaves a concave scallop 208 on the trench sidewall. This shape is then repeated for each successive etch step, resulting in a sidewall with a wavy, scalloped profile. Scalloping is particularly a problem when the etched trench is to be used as a mold in a subsequent process and when the silicon trench surface is to be used in an optical component.

It would therefore be useful to provide a method which could be used to reduce or substantially eliminate scalloping from a silicon trench sidewall after a deep trench etch process.

SUMMARY OF THE INVENTION

We have discovered a method for smoothing a trench sidewall after a deep trench silicon etch process which reduces scalloping present after a silicon trench etch. According to the method, following a silicon trench etch process, a fluorine-containing plasma is introduced into a processing chamber which contains the silicon substrate. The fluorine-containing plasma is typically generated from an inorganic fluorine-containing compound. The fluorine-containing plasma may, for example, be generated from a compound selected from the group consisting of $SF_6$, $CF_4$, $NF_3$, and combinations thereof. Typically, the fluorine-containing compound is $SF_6$. Typical process conditions for performing the trench sidewall smoothing method are as follows: 1 sccm–200 sccm of an inorganic fluorine-containing compound, where $SF_6$ makes up from about 10 volume % to about 85 volume % of the plasma source gas; 500 W–3000 W plasma source power ($8 \times 10^9$ $e^-/cm^3$ to about $3 \times 10^{11}$ $e^-/cm^3$ plasma density); 0–30 W (–10 V to –40 V) substrate bias power; 1 mTorr–30 mTorr process chamber pressure; and 20° C.–120° C. substrate temperature. Exposure to the $SF_6$ plasma is typically performed for a time period ranging from about 10 seconds to about 600 seconds. More typically, the time period ranges from about 30 seconds to about 300 seconds.

A very mild isotropic etch, which occurs upon exposure of the silicon trench sidewalls to the $SF_6$ plasma, selectively smooths out silicon peaks along the sidewalls of the etched trench. Although the scallops along the trench sidewall are smoothed by the etch process, the process frequently creates a porosity along the outer surface of the trench sidewall. This porosity is removed by oxidizing the silicon trench sidewall, and then removing the resulting silicon oxide from the trench sidewall. Typically, oxidation is carried out by exposing the de-scalloped trench substrate to oxygen in a rapid thermal passivation (RTP) chamber, and then exposing the silicon oxide formed from the porous trench surface to an HF solution or to vaporous HF.

The method of the invention provides silicon trenches having smooth sidewalls which are suitable for use in a variety of applications where sidewall smoothness is an important issue, such as micromolding applications. For a trench having a beginning sidewall roughness of about 2 $\mu$m, sidewall roughness is typically reduced to about 0.5 $\mu$m after performing the present sidewall smoothing method. For a trench having a beginning sidewall roughness of about 0.1 $\mu$m, sidewall roughness is typically reduced to less than about 0.05 $\mu$m after performing the present sidewall smoothing method.

BRIEF DESCRIPTION OF THE DRAWINGS

FIG. 1A shows a typical starting structure 100 for performing a presently known etch/deposition process. Structure 100 comprises a patterned photoresist layer 104 overlying a bare silicon wafer 102.

FIG. 1B shows structure 100 after performance of a relatively anisotropic $SF_6$ etch for initial trench 106 formation.

FIG. 1C shows structure 100 after the performance of a first polymer deposition step. A thick layer 108 of polymer has been deposited on the bottom and sidewalls of trench 106.

FIG. 1D shows structure 100 after the start of the second $SF_6$ etch cycle. The bottom 110 of trench 106 has been cleared of polymer.

FIG. 1E shows structure 100 after the completion of the second $SF_6$ etch step.

FIG. 3A shows a silicon trench sidewall 300 which has been smoothed using the post-etch treatment method of the invention.

FIG. 3B shows the silicon oxide layer 306 formed on trench sidewall 300 after oxidation.

FIG. 3C shows the silicon trench sidewall 310 which remains after removal of oxide layer 306.

DETAILED DESCRIPTION OF EXEMPLARY EMBODIMENTS

Disclosed herein is a method of smoothing a trench sidewall after a deep trench silicon etch process. Exemplary processing conditions for performing the method of the invention are set forth below.

As a preface to the detailed description, it should be noted that, as used in this specification and the appended claims, the singular forms "a", "an", and "the" include plural referents, unless the context clearly dictates otherwise.

I. An Apparatus for Practicing the Invention

The embodiment example etch processes described herein were carried out in a CENTURA® Integrated Processing System available from Applied Materials, Inc., of Santa Clara, Calif. This apparatus is described in detail below; however, it is contemplated that other apparatus known in the industry may be used to carry out the invention.

Figure 4A:
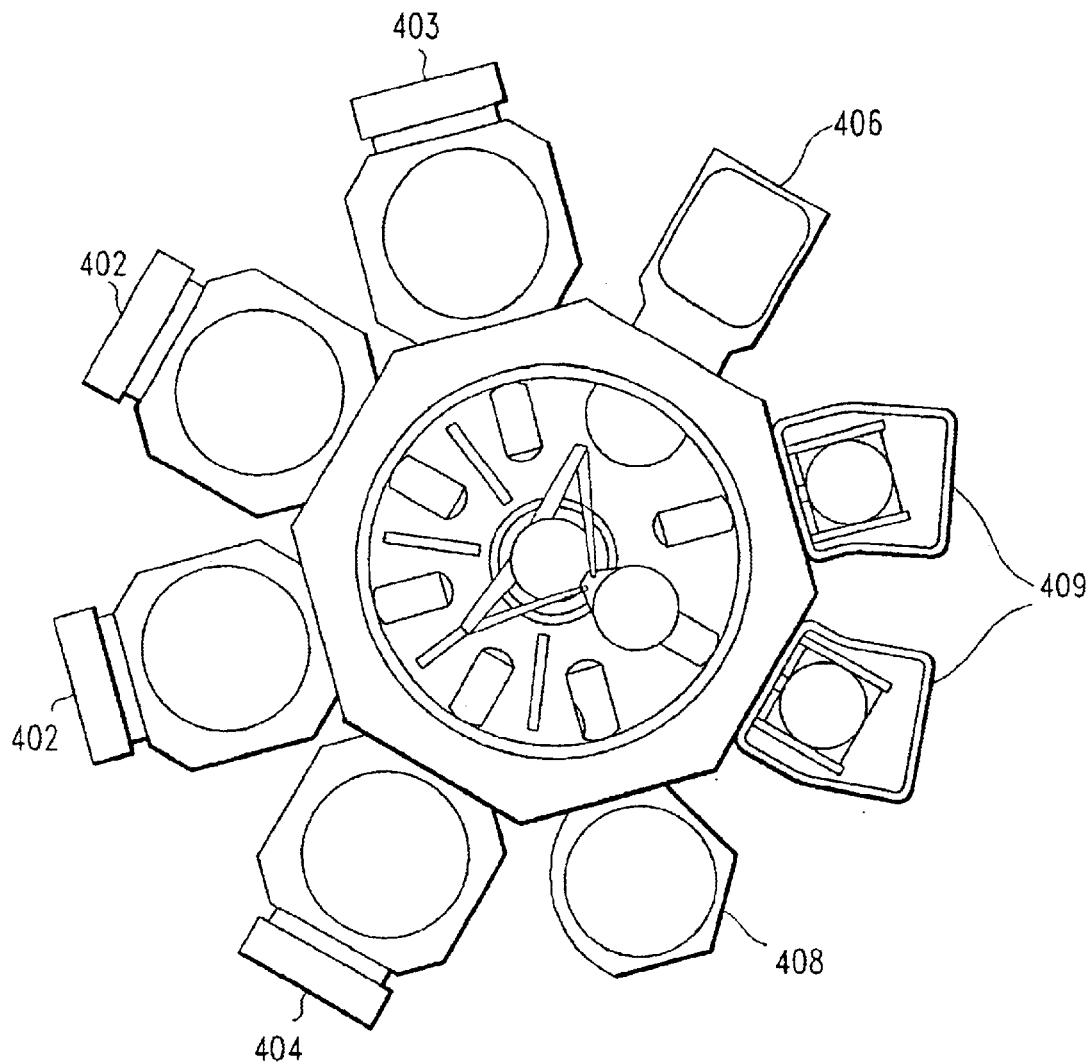
FIG. 4A shows a schematic of a multi-chambered semiconductor processing system of the kind which can be used to carry out the processes described herein.

FIG. 4A shows an elevation schematic of the CENTURA® Integrated Processing System. The CENTURA® Integrated Processing System is a fully automated semiconductor fabrication system, employing a single-wafer, multichamber, modular design which accommodates 200-mm or 300-mm wafers. For example, as shown in FIG. 4A, the CENTURA® etch system may include decoupled plasma source (DPS) etch chambers 402; deposition chamber 403; advanced strip-and-passivation (ASP) chamber 404; wafer orienter chamber 406; cooldown chamber 408; and independently operated loadlock chambers 409.

Figure 4B:
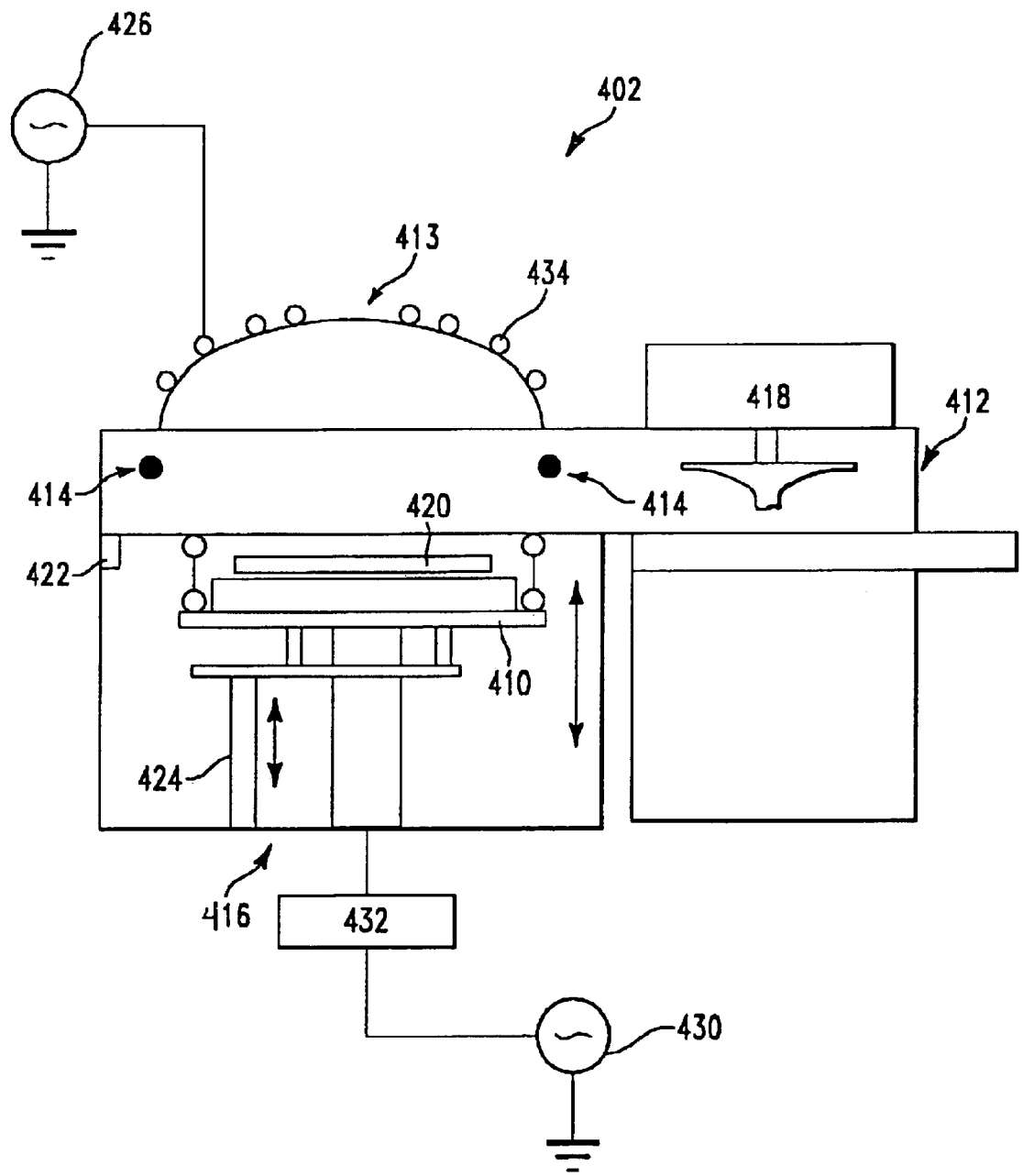
FIG. 4B shows a schematic of a cross-sectional view of a plasma etch chamber of the kind which can be used to carry out the etching processes described herein.

FIG. 4B is a schematic of an individual CENTURA® DPS™ etch chamber 402 of the type which may be used in the Applied Materials' CENTURA® Integrated Processing System. The equipment shown in schematic in FIG. 4B includes a Decoupled Plasma Source (DPS) of the kind described by Yan Ye et al. at the Proceedings of the Eleventh International Symposium of Plasma Processing, May 7, 1996, and as published in the Electrochemical Society Proceedings, Volume 96-12, pp. 222–233 (1996). The CENTURA® DPS™ etch chamber 402 is configured to be mounted on a standard CENTURA® mainframe.

The CENTURA® DPS™ etch chamber 402 consists of an upper chamber 412 having a ceramic dome 413, and a lower chamber 416. The lower chamber 416 includes an electrostatic chuck (ESC) cathode 410. Gas is introduced into the chamber via gas injection nozzles 414 for uniform gas distribution. Chamber pressure is controlled by a closed-loop pressure control system (not shown) with a throttle valve 418. During processing, a substrate 420 is introduced into the lower chamber 416 through inlet 422. The substrate 420 is held in place by means of a static charge generated on the surface of electrostatic chuck (ESC) cathode 410 by applying a DC voltage to a conductive layer located under a dielectric film on the chuck surface. The cathode 410 and substrate 420 are then raised by means of a wafer lift 424 and a seal is created against the upper chamber 412 in position for processing. Etch gases are introduced into the upper chamber 412 via the ceramic gas injection nozzles 414. The etch chamber 402 uses an inductively coupled plasma source power 426 operating at 2 MHz, which is connected to inductive coil 434 for generating and sustaining a high density plasma. The wafer is biased with an RF source 430 and matching network 432 operating within the range of 100 kHz to 13.56 MHz; more typically, within the range of 100 kHz to 2 MHz. Power to the plasma source 426 and substrate biasing means 430 are controlled by separate controllers (not shown).

The temperature on the surface of the etch chamber walls is controlled using liquid-containing conduits (not shown) which are located in the walls of the etch chamber 402. The temperature of the semiconductor substrate is controlled using the temperature of the electrostatic chuck cathode 410 upon which the substrate 420 rests. Typically, a helium gas flow is used to facilitate heat transfer between the substrate and the pedestal.

As previously mentioned, although the etch process chamber used to process the substrates described in the Examples presented herein is shown in schematic in FIG. 4B, any of the etch processors available in the industry should be able to take advantage of the etch chemistry described herein, with some adjustment to other process parameters.

II. Exemplary Method of the Invention for Smoothing a Trench Sidewall After a Deep Trench Silicon Etching Process Applicants have discovered a post-etch treatment, sidewall smoothing method which reduces or substantially eliminates scalloping that has occurred during a deep trench silicon etch method, such as the method described in the "Brief Description of the Background Art", above, with reference to FIGS. 1A–1E.

Upon completion of a deep silicon trench etch process, optionally, an oxygen plasma is used to clear any remaining polymer and residual photoresist from trench surfaces. Typical processing conditions for use when an oxygen plasma clean-up step is needed are presented in Table One, below.

TABLE ONE

Process Conditions for Oxygen Plasma Clean-up Step

| Process Parameter | Range of Process Conditions | Typical Process Conditions | Optimum Known Process Conditions |
|---|---|---|---|
| $O_2$ Flow Rate (sccm) | 50–500 | 100–300 | 200 |
| Plasma Source Power (W) | 500–3000 | 700–2000 | 1000 |
| Substrate Bias Power (W) | 0–100 | 0–50 | 5–10 |
| Substrate Bias Voltage (−V) | 0–200 | 20–150 | 40–100 |
| RF Frequency (kHz) | 100–13,560 | 100–2000 | 200–400 |
| Process Chamber Pressure (mTorr) | 20–200 | 25–100 | 30 |
| Substrate Temperature (° C.)* | 40–120 | 50–100 | 60 |
| Clean-Up Step Time Period (seconds) | 10–600 | 100–400 | 180 |

*The substrate temperature provided is for an etch chamber having a decoupled plasma source. If a different type of etch chamber is used, the substrate temperature may be within the range of about 200° C. up to 250° C. during the oxygen plasma clean-up.

Following the optional oxygen plasma clean-up step, a plasma generated from a fluorine-containing gas is introduced into the processing chamber at a very low pressure and at a low substrate bias. This very mild isotropic etch selectively smooths out silicon peaks along the sidewalls of the etched trench. This is due to the geometry of the isotropic etch: a peak is etched from multiple directions, while a flat surface is etched from only one direction.

The fluorine-containing gas is typically selected from the group consisting of $SF_6$, $CF_4$, $NF_3$, and combinations thereof. Sulfur hexafluoride ($SF_6$) has been shown to provide particularly good results. The plasma source gas may optionally include a non-reactive, diluent gas, such as, for example and not by way of limitation, helium, argon, xenon, krypton, and combinations thereof. The non-reactive, diluent gas is typically helium (He).

Typical process conditions for performing the sidewall smoothing method using $SF_6$ are provided in Table Two, below:

TABLE TWO

Process Conditions for Sidewall Smoothing Method Using $SF_6$

| Process Parameter | Range of Process Conditions | Typical Process Conditions | Optimum Known Process Conditions |
|---|---|---|---|
| $SF_6$ Flow Rate (sccm) | 2–50 | 5–25 | 15–20 |
| He Flow Rate (sccm)* | 2–200 | 2–50 | 2–10 |
| Plasma Source Power (W) | 200–3000 | 500–2000 | 800–1200 |
| Substrate Bias Power (W) | 0–20 | 0–10 | 0 |
| Substrate Bias Voltage (−V) | 0–200 | 20–150 | 20–40 |
| RF Frequency (kHz) | 100–13,560 | 100–2000 | 200–400 |
| Process Chamber Pressure (mTorr) | 1–30 | 2–25 | 5–20 |
| Substrate Temperature (° C.) | 40–120 | 50–100 | 50–70 |
| Sidewall Smoothing Time Period (seconds) | 10–600 | 30–300 | 30–200 |

Figure 3A:
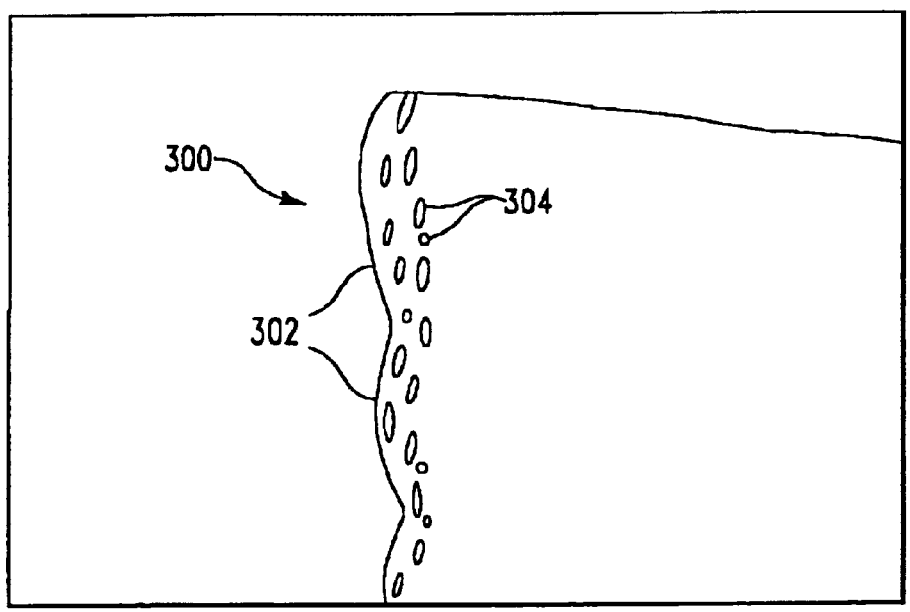
FIGS. 3A–3C illustrate the present sidewall smoothing method.

FIG. 3A shows a silicon trench sidewall 300 which has been smoothed according to the sidewall smoothing method, using the following processing conditions: 10 sccm $SF_6$; 1000 W source power; 0 W substrate bias power; 0 V substrate bias (self-bias); 400 kHz RF frequency; 5 mTorr process chamber pressure; and 60° C. substrate temperature. The substrate smoothing method was performed for a period of 100 seconds.

Figure 1A:
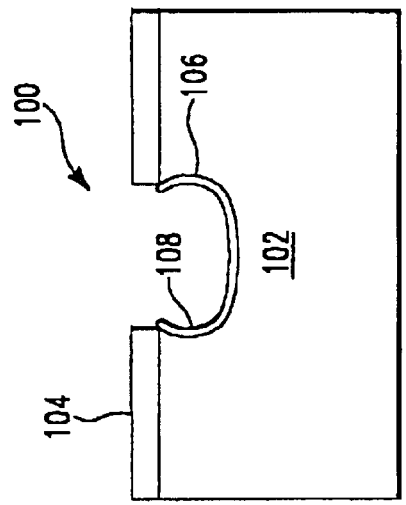
FIGS. 1A–1E illustrate the steps in a presently known etch/deposition process for forming a deep trench in silicon.
Figure 1B:
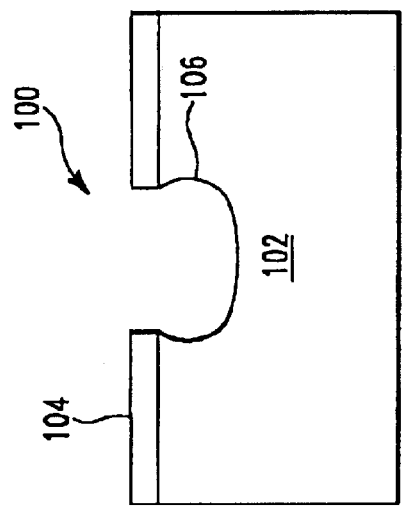
Figure 1C:
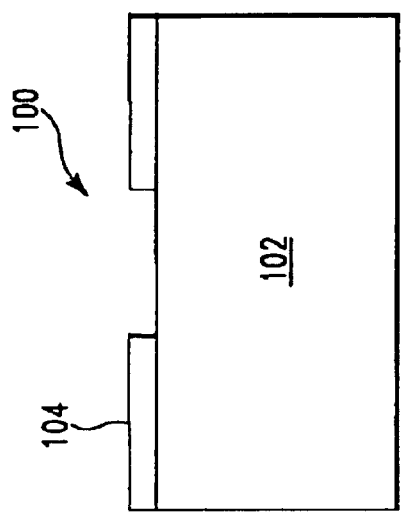
Figure 1D:
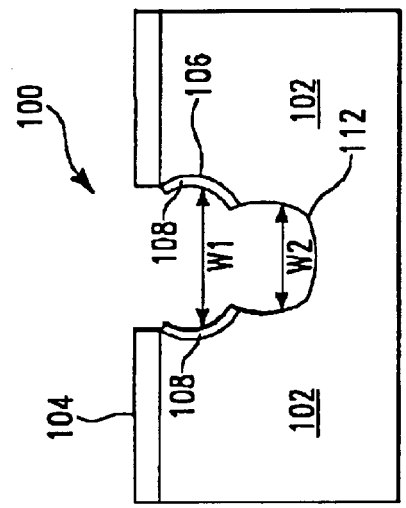
Figure 1E:
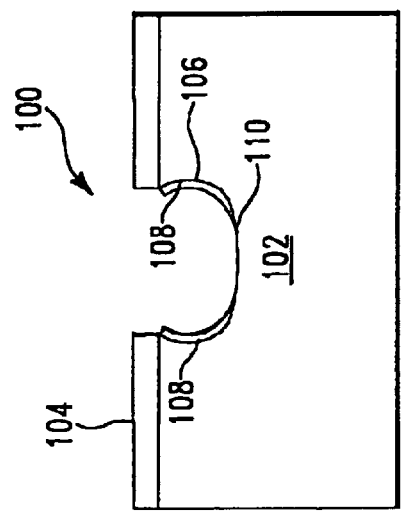
Figure 2:
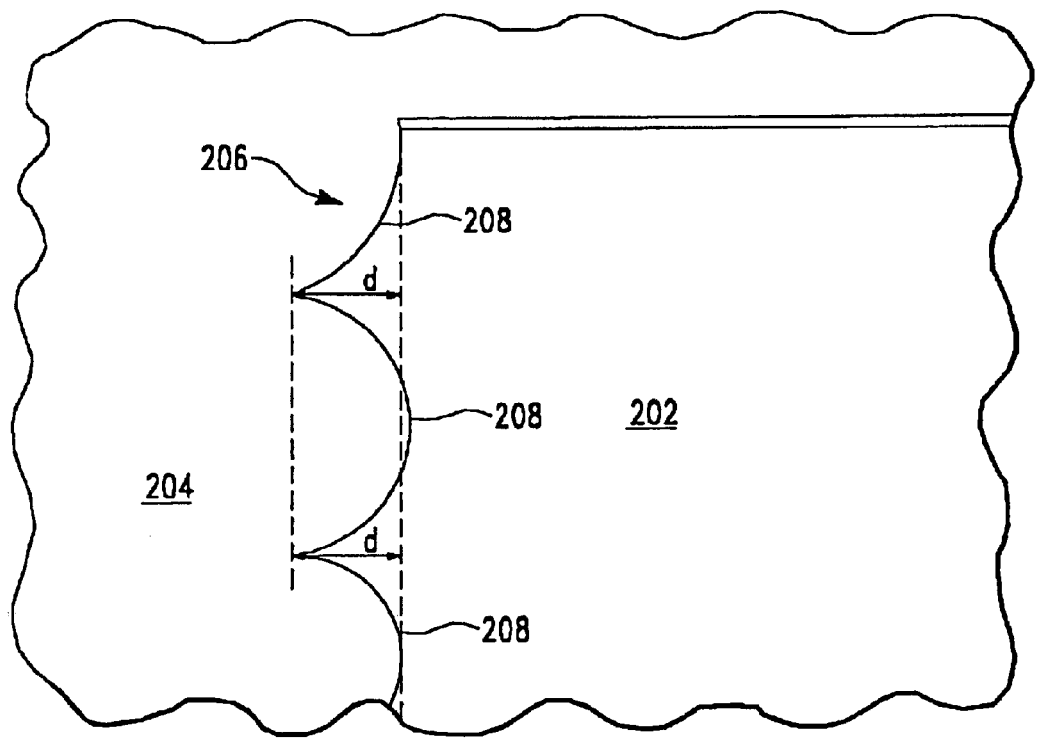
FIG. 2 shows a silicon trench sidewall 206 exhibiting 0.8 micron deep (d) scallops 208.

Note the minimization in scalloping 302 shown in FIG. 3A compared to the heavily scalloped trench sidewall 208 of FIG. 2. Exposure of the silicon sidewall 300 to the $SF_6$ plasma can result in sidewall porosity 304, as shown in FIG. 3A. This porosity can be removed by oxidizing the sidewall 300, then removing the resulting silicon oxide using an HF dip or by exposure of the sidewall 300 to vaporous HF. The porosity actually aids in the oxidation of the sidewall, because the oxygen can penetrate deeper into the sidewall in a short period of time due to the presence of pores 304.

Figure 3B:
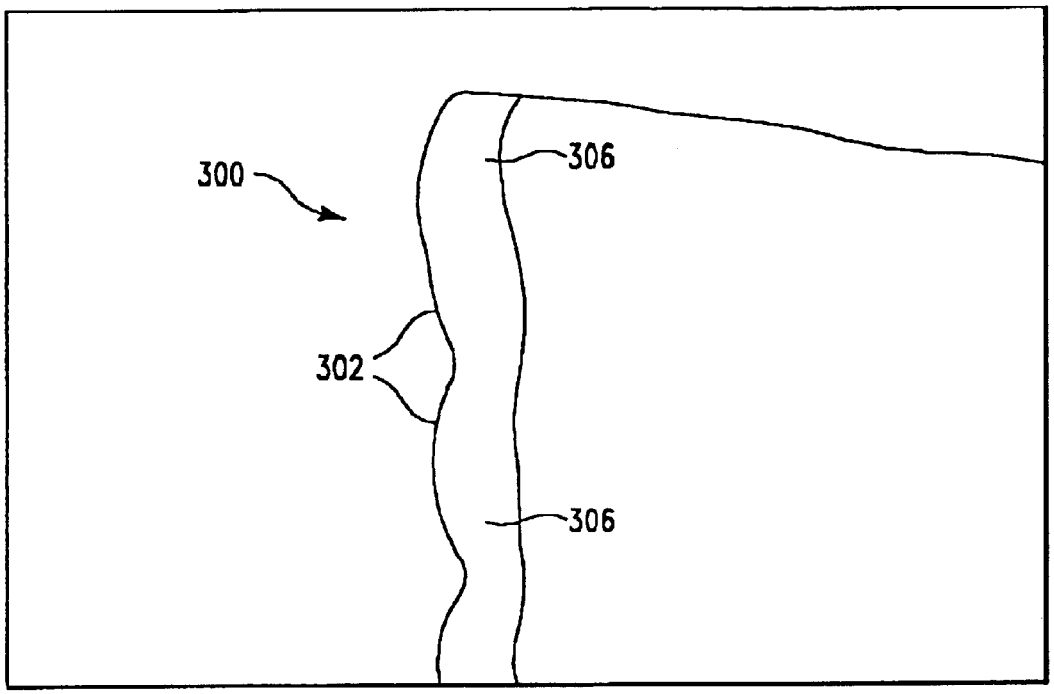

FIG. 3B shows the silicon oxide layer 306 formed on trench sidewall 300 after oxidation. Typically, oxidation is carried out by placing the de-scalloped trench substrate in a rapid thermal passivation (RTP) chamber, for a time period of about 10 seconds to about 60 seconds, using techniques known in the art.

Silicon oxide layer 306 is then removed by exposure of trench sidewall 300 to an HF solution or to vaporous HF. For example, silicon oxide layer 306 can be removed by exposure of trench sidewall 300 to a 6:1 HF solution for a time period of about 5 seconds to about 180 seconds; typically, about 10–15 seconds or less. Alternatively, silicon oxide layer 306 can be removed by exposure of trench sidewall 300 to vaporous HF at a process chamber pressure within the range of about 150 mTorr to about 5000 mTorr, at a substrate temperature of about 20° C. to about 60° C., for a time period of about 5 seconds to about 180 seconds.

Figure 3C:
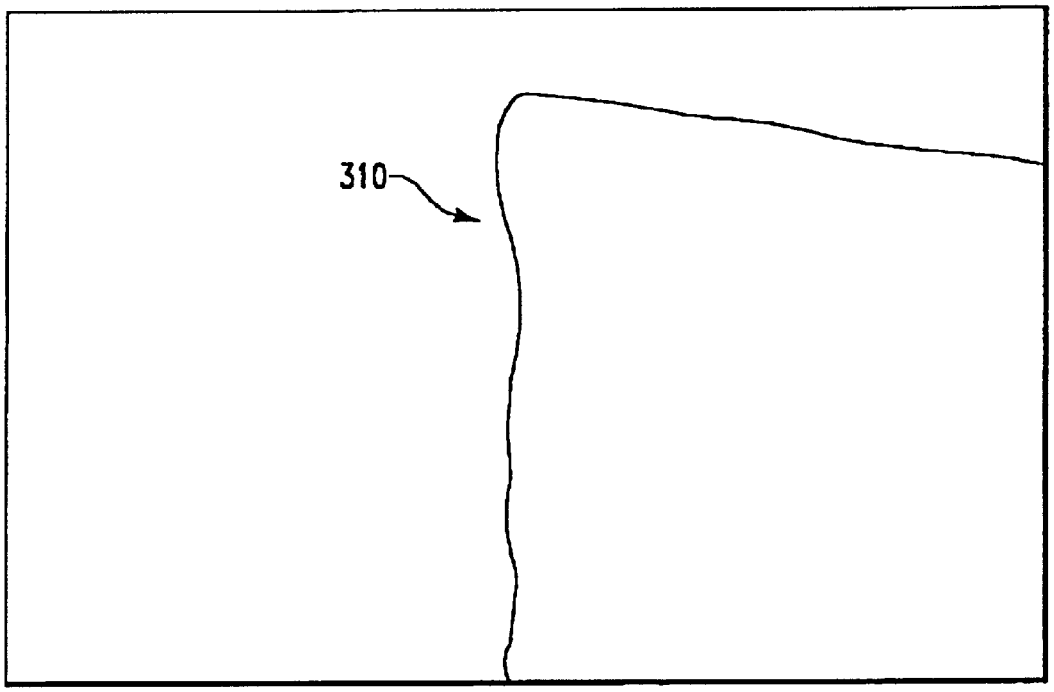

FIG. 3C shows the silicon trench sidewall 310 which remains after removal of oxide layer 306. As shown in FIG.

3C, after removal of oxide layer 306, the silicon trench sidewall 310 is actually smoother than the silicon trench sidewall 300 prior to the performance of the oxidation step (shown in FIG. 3A), because removal of the oxide layer smoothes any scalloping which may remain after performance of the mild $SF_6$ etch.

In an alternative embodiment, $CF_4$, in combination with $O_2$, may be used to perform sidewall smoothing. $CF_4$, when used in combination with $O_2$, typically produces a milder etch than the more aggressive $SF_6$. Therefore, the combination of $CF_4$ and $O_2$ is particularly useful in cases where the scalloping is not as severe as that shown in FIG. 2. For example, $CF_4/O_2$ is particulary useful in cases where the scallop 208 depth (d) is less than about 0.3 microns.

Typical process conditions for performing the sidewall smoothing method using $CF_4/O_2$ are provided in Table Three, below:

TABLE THREE

Process Conditions for Sidewall Smoothing Method Using $CF_4/O_2$

| Process Parameter | Range of Process Conditions | Typical Process Conditions | Optimum Known Process Conditions |
|---|---|---|---|
| $CF_4$ Flow Rate (sccm) | 10–200 | 50–150 | 80–120 |
| $O_2$ Flow Rate (sccm) | 10–300 | 20–200 | 20–40 |
| Plasma Source Power (W) | 500–3000 | 500–1500 | 800–1200 |
| Substrate Bias Power (W) | 0–100 | 0–50 | 0 |
| Substrate Bias Voltage (−V) | 0–200 | 20–150 | 20–100 |
| RF Frequency (kHz) | 100–13,560 | 100–2000 | 200–400 |
| Process Chamber Pressure (mTorr) | 1–75 | 5–50 | 5–15 |
| Substrate Temperature (° C.) | 20–120 | 40–80 | 50–70 |
| Sidewall Smoothing Time Period (seconds) | 10–600 | 30–300 | 30–120 |

After performance of sidewall smoothing using $CF_4/O_2$, any residual porosity can optionally be removed by oxidizing the sidewall, then removing the resulting silicon oxide using an HF dip or vaporous HF, as described above. Because the use of $CF_4/O_2$ results in a milder etch than $SF_6$, any resulting porosity is typically not as severe as that shown in FIG. 3A; therefore, performance of the oxidation/oxidation removal steps may not be necessary after sidewall smoothing with $CF_4/O_2$.

The present invention provides an effective method for smoothing a trench sidewall after the performance of a deep trench silicon etch process. Performing the method of the invention after a deep trench silicon etch process provides trenches having smooth sidewalls which are suitable for use in a variety of applications where sidewall smoothness is an important issue, such as micromolding applications. The sidewall smoothing method of the invention may be performed following any deep trench silicon etch process known in the art.

The above described exemplary embodiments are not intended to limit the scope of the present invention, as one skilled in the art can, in view of the present disclosure expand such embodiments to correspond with the subject matter of the invention claimed below.

We claim:

1. A post-etch treatment method of smoothing a scalloped silicon trench sidewall after a deep trench etch process, wherein said method comprises exposing said silicon trench sidewall to a plasma generated from a fluorine-containing gas, at a process chamber pressure within the range of about 1 mTorr to about 30 mTorr, for a time period within the range of about 10 seconds to about 600 seconds, at a plasma density ranging from about $8 \times 10^9$ $e^-/cm^3$ to about $3 \times 10^{11}$ $e^-/cm^3$, and wherein a substrate bias voltage within the range of about −10 V to about −40 V is applied during the performance of said post-etch treatment method, whereby an etched silicon sidewall exhibits reduced scalloping after performance of said post-etch treatment method when compared with said etched silicon sidewall scalloping prior to preformance of said post-etch treatment method.

2. The post-etch treatment method of claim 1, wherein said post-etch treatment method is performed for a time period within the range of about 30 seconds to about 300 seconds.

3. The post-etch treatment method of claim 1, wherein said fluorine-containing gas is provided at a flow rate within the range of about 2 sccm to about 50 sccm.

4. The post-etch treatment method of claim 1, wherein said method further includes the step of exposing said silicon trench sidewall to an oxygen plasma, whereby deposited polymer is removed from substrate surfaces, prior to exposure of said silicon trench sidewall to a plasma generated from a fluorine-containing gas.

5. The post-etch treatment method of claim 1, wherein said process chamber pressure is within the range of about 2 mTorr to about 25 mTorr.

6. The post-etch treatment method of claim 5, wherein said process chamber pressure is within the range of about 5 mTorr to about 20 mTorr.

7. The post-etch treatment method of claim 1, wherein said fluorine-containing gas is selected from the group consisting of $SF_6$, $CF_4$, $NF_3$, and combinations thereof.

8. The post-etch treatment method of claim 7, wherein said fluorine-containing gas is $SF_6$.

9. The post-etch treatment method of claim 7, wherein said fluorine-containing gas is $CF_4$, and wherein said $CF_4$ is provided in combination with $O_2$.

10. The post-etch treatment method of claim 1, wherein said post-etch treatment method further includes the steps of oxidizing said silicon trench sidewall, then removing oxidation from said sidewall, wherein said oxidizing and said oxidation removal steps are performed following exposure of said sidewall to said fluorine-containing plasma.

11. The post-etch treatment method of claim 10, wherein said step of removing said oxidation is performed by exposing said sidewall to an HF solution for a time period ranging from about 5 seconds to about 180 seconds.

12. The post-etch treatment method of claim 10, wherein said step of removing said oxidation is performed by exposing said sidewall to vaporous HF for a time period ranging from about 5 seconds to about 180 seconds.

13. A post-etch treatment method of smoothing a rough surface on a sidewall of a plasma etched recession into a silicon substrate, wherein said method comprises exposing said sidewall to a plasma comprising a fluorine species, with said substrate biased to a voltage ranging from about −0 V to about −40 V by application of a first power source, and said plasma being generated by a second, independent power source to produce a plasma having a density ranging from about $8 \times 10^9$ $e^-/cm^3$ to about $3 \times 10^{11}$ $e^-/cm^3$, at a process chamber pressure ranging from about 1 mTorr to about 30 mTorr, whereby an etched silicon sidewall of a plasma etched recession exhibits reduced roughness after performance of said post-etch treatment method when compared with said etched silicon sidewall roughness prior to performance of said post-etch treatment method.

14. A method according to claim 13, where said fluorine-containing species are generated from a fluorine-containing gas selected from the group consisting of $SF_6$, $CF_4$, $NF_3$, and combinations thereof.

15. A method according to claim 13, wherein said fluorine-containing species are generated from a gas which includes $CF_4$ and oxygen.

16. A method of post-etch treatment according to claim 13, wherein, prior to said post-etch treatment, said sidewall of said etched recession is exposed to an oxygen plasma.

17. A method of post-etch treatment according to claim 13, wherein, subsequent to said post etch treatment, said sidewall of said etched recession is oxidized to produce a silicon oxide layer, which oxide layer is subsequently removed by exposure to a plasma-contaimng fluorine species.

18. A method of post-etch treatment according to claim 13, wherein, subsequent to said post etch treatment, said sidewall of said etched recession is oxidized to produce a silicon oxide layer, which oxide layer is subsequently removed by exposure to vaporous HF.

19. A method of post-etch treatment according to claim 13, wherein, subsequent to said post etch treatment, said sidewall of said etched recession is oxidized to produce a silicon oxide layer, which oxide layer is subsequently removed by exposure to an HF solution.

20. A method of post-etch treatment according to claim 13, wherein, prior to exposure of said sidewall of said etched recession to a plasma comprising fluorine species, said etched recession sidewall is exposed to an oxygen plasma to remove deposited polymer residue from said recession sidewall surfaces.

* * * * *